United States Patent
Ohno et al.

(10) Patent No.: US 8,331,140 B2
(45) Date of Patent: Dec. 11, 2012

(54) CURRENT INJECTION MAGNETIC DOMAIN WALL MOVING ELEMENT

(75) Inventors: Hideo Ohno, Sendai (JP); Fumihiro Matsukura, Sendai (JP); Daichi Chiba, Sendai (JP); Michihiko Yamanouchi, Sendai (JP)

(73) Assignees: Japan Science and Technology Agency, Kawaguchi-shi (JP); Tohoku University, Sendai-shi (JP)

( * ) Notice: Subject to any disclaimer, the term of this patent is extended or adjusted under 35 U.S.C. 154(b) by 626 days.

(21) Appl. No.: 10/585,638

(22) PCT Filed: Jan. 14, 2005

(86) PCT No.: PCT/JP2005/000336
§ 371 (c)(1),
(2), (4) Date: Jan. 4, 2007

(87) PCT Pub. No.: WO2005/069368
PCT Pub. Date: Jul. 28, 2005

(65) Prior Publication Data
US 2008/0137405 A1    Jun. 12, 2008

(30) Foreign Application Priority Data
Jan. 15, 2004   (JP) .................. 2004-007514

(51) Int. Cl.
*G11C 11/15* (2006.01)
(52) U.S. Cl. .............. 365/173; 257/E43.004
(58) Field of Classification Search .......... 257/295, 257/E29.167, E29.323, E43.001–E43.007, 257/E27.005–E27.006, E27.008, E29.164, 257/E29.272, 81, 82, 116, 117, 432–437, 257/457, 459, 749, 421–422
See application file for complete search history.

(56) References Cited

U.S. PATENT DOCUMENTS

| 4,103,315 | A | * | 7/1978 | Hempstead et al. ......... 360/110 |
| 5,294,287 | A | * | 3/1994 | Chang et al. .................. 117/88 |
| 5,390,061 | A | * | 2/1995 | Nakatani et al. ........... 360/324.2 |
| 5,734,605 | A | * | 3/1998 | Zhu et al. ...................... 365/173 |
| 5,768,181 | A | * | 6/1998 | Zhu et al. ...................... 365/158 |
| 5,835,003 | A | * | 11/1998 | Nickel et al. ................. 338/32 R |
| 6,005,798 | A | * | 12/1999 | Sakakima et al. ............ 365/158 |
| 6,456,467 | B1 | * | 9/2002 | Mao et al. ..................... 360/319 |
| 6,713,195 | B2 | * | 3/2004 | Wang et al. ................. 428/811.2 |
| 2001/0007532 | A1 | * | 7/2001 | Sato et al. ..................... 365/173 |
| 2003/0209770 | A1 | * | 11/2003 | Flatte et al. ................... 257/421 |

OTHER PUBLICATIONS

Grollier, J., Switching a spin valve back and forth by current-induced domain wall motion, Jul. 21, 2003, Applied Physics Letters, vol. 83, No. 3, pp. 509-511.*

(Continued)

*Primary Examiner* — David Vu
*Assistant Examiner* — Jonathan Han
(74) *Attorney, Agent, or Firm* — Oblon, Spivak, McClelland, Maier & Neustadt, L.L.P.

(57) ABSTRACT

The present invention provides a current injection-type magnetic domain wall-motion device which requires no external magnetic field for reversing the magnetization direction of a ferromagnetic body and which has low power consumption. The current injection-type magnetic domain wall-motion device includes a microjunction structure including two magnetic bodies (a first magnetic body 1 and a second magnetic body 2) having magnetization directions antiparallel to each other and a third magnetic body 3 sandwiched therebetween. The magnetization direction of the device is controlled in such a manner that a pulse current (a current density of $10^4$–$10^7$ A/cm$^2$) is applied across junction interfaces present in the microjunction structure such that a magnetic domain wall is moved by the interaction between the magnetic domain wall and the current in the same direction as that of the current or in the direction opposite to that of the current.

21 Claims, 8 Drawing Sheets

OTHER PUBLICATIONS

Grollier et al., "Switching a Spin Valve Back and Forth by Current-Induced Domain Wall Motion", Applied Physics Letters. vol. 83, No. 3, pp. 509-511, Jul. 21, 2003.

Yamaguchi et al., "Real-Space Observation of Current-Driven Domain Wall Motion in Submicron Magnetic Wires", Physical Review Letters, vol. 92, No. 7, Feb. 20, 2004.

* cited by examiner

CURRENT INJECTION MAGNETIC DOMAIN WALL MOVING ELEMENT

TECHNICAL FIELD

The present invention relates to magnetic semiconductor devices and particularly relates to a current injection-type magnetic domain wall-motion device.

BACKGROUND ART

In order to reverse the direction of the magnetizations of magnetic bodies included in recording media, application of external magnetic fields has been necessary.

Patent Document 1: Japanese Unexamined Patent Application Publication No. 2003-272114
Patent Document 2: Japanese Unexamined Patent Application Publication No. 2003-272112
Non-patent Document 1: Science, vol. 301, pp. 943-945 (Aug. 15, 2003)

DISCLOSURE OF INVENTION

In order to increase the integration density of magnetic nonvolatile solid-state memories, the microfabrication of memory cells is essential. An increase in the influence of demagnetization fields due to the microfabrication causes an increase in the intensity of external magnetic fields necessary for reversing the direction of the magnetizations of ferromagnetic bodies. This leads to an increase in the consumption of electricity for generating magnetic fields. Therefore, it is necessary to develop a new scheme to reverse the magnetization direction of a small magnetic body.

In view of the foregoing circumstances, it is an object of the present invention to provide a current injection-type magnetic domain wall-motion device which requires no external magnetic field for reversing the magnetization direction of a ferromagnetic body and which has low power consumption.

In order to achieve the above object, the present invention provides a current injection-type magnetic domain wall-motion device as described below.

(1) A current injection-type magnetic domain wall-motion device includes a microjunction structure including a first magnetic body, a second magnetic body with a magnetization direction antiparallel to that of the first magnetic body, and a third magnetic body sandwiched therebetween. The magnetization direction of the device is controlled in such a manner that a current is applied across microjunction interfaces present in the microjunction structure such that a magnetic domain wall is moved by the interaction between the magnetic domain wall and the current in the same direction as that of the current or in the direction opposite to that of the current.

(2) In the current injection-type magnetic domain wall-motion device described in Item (1), the magnetic bodies are made of a magnetic semiconductor.

(3) In the current injection-type magnetic domain wall-motion device described in Item (2), the magnetic semiconductor is a (Ga, Mn)As ferromagnetic semiconductor.

(4) In the current injection-type magnetic domain wall-motion device described in Item (2), the magnetic semiconductor is an (In, Mn)As ferromagnetic semiconductor.

(5) In the current injection-type magnetic domain wall-motion device described in any one of Items (1) to (4), the current is a pulse current.

(6) In the current injection-type magnetic domain wall-motion device described in Item (5), the pulse current has a current density of $10^4$-$10^7$ A/cm$^2$.

(7) In the current injection-type magnetic domain wall-motion device described in Item (1), the first magnetic body and the second magnetic body with a magnetization direction antiparallel to that of the first magnetic body are prepared by film formation in a magnetic field.

(8) In the current injection-type magnetic domain wall-motion device described in Item (1), the magnetization directions of the first and second magnetic bodies are aligned antiparallel to each other with an external magnetic field using a difference in coercive force therebetween after the film formation.

(9) In the current injection-type magnetic domain wall-motion device described in Item (8), the first and second magnetic bodies are made of different materials.

(10) In the current injection-type magnetic domain wall-motion device described in Item (1), the first and second magnetic bodies are made of the same material and the second magnetic body is magnetically coupled with an antiferromagnetic film disposed on the second magnetic body such that the first and second magnetic bodies have different coercive forces.

(11) In the current injection-type magnetic domain wall-motion device described in Item (1), the first and second magnetic bodies are made of the same material, and have different film thicknesses, such that the first and second magnetic bodies have different coercive forces.

(12) In the current injection-type magnetic domain wall-motion device described in Item (1), the first and second magnetic bodies are made of the same material, and have different shapes, such that the first and second magnetic bodies have different coercive forces due to difference of shape anisotropy.

(13) In the current injection-type magnetic domain wall-motion device described in Item (2), (3), or (4), different external electric fields are applied to the first and second magnetic bodies made of magnetic semiconductor, such that the first and second magnetic bodies have different coercive forces.

(14) In the current injection-type magnetic domain wall-motion device described in Item (1), the third magnetic body has a reduced cross-sectional area such that a magnetic domain wall is encouraged to position at a junction interface between the first and third magnetic bodies or between the second and third magnetic bodies, the magnetic domain wall being present between the first and second magnetic bodies because of the antiparallel magnetization directions of the first and second magnetic bodies, whereby the energy loss due to the creation of the magnetic domain wall in the third magnetic body is less than both that in the first magnetic body and that in the second magnetic body.

(15) In the current injection-type magnetic domain wall-motion device described in Item (1), the third magnetic body is made of a material with a magnetization smaller than that of a material for forming the first and second magnetic body such that a magnetic domain wall is encouraged to position at a junction interface between the first and third magnetic bodies or between the second and third magnetic bodies, the magnetic domain wall being present between the first and second magnetic bodies because of the antiparallel magnetization directions of the first and second magnetic bodies, whereby the energy loss due to the creation of the magnetic domain wall in the third magnetic body is less than both that in the first magnetic body and that in the second magnetic body.

(16) In the current injection-type magnetic domain wall-motion device described in Item (1), the first to third magnetic bodies are made of the same material and the magnetization of the third magnetic body is rendered smaller than both that of the first magnetic body and that of the second magnetic body by applying an external electric field to the third magnetic body such that a magnetic domain wall is encouraged to position at a junction interface between the first and third magnetic bodies or between the second and third magnetic bodies, the magnetic domain wall being present between the first and second magnetic bodies because of the antiparallel magnetization directions of the first and second magnetic bodies, whereby the energy loss due to the creation of the magnetic domain wall in the third magnetic body is less than both that in the first magnetic body and that in the second magnetic body.

(17) In the current injection-type magnetic domain wall-motion device described in Item (1), the first and third magnetic bodies have a constriction at a junction interface therebetween and the second and third magnetic bodies have a constriction at a junction interface therebetween such that a magnetic domain wall is encouraged to be trapped at one of the constrictions and is therefore encouraged to be positioned at a junction interface between the first and third magnetic bodies or between the second and third magnetic bodies, the magnetic domain wall being present between the first and second magnetic bodies because of the antiparallel magnetization directions of the first and second magnetic bodies.

(18) In the current injection-type magnetic domain wall-motion device described in Item (1), the magnetization direction of the device can be read out.

(19) In the current injection-type magnetic domain wall-motion device described in Item (18), the magnetization state of the third magnetic body is read out in such a manner that the resistance of the element is measured by applying a small current that is insufficient to move the magnetic domain wall, to a current injection terminal using a feature that the device has different resistances depending whether the magnetic domain wall is located at an interface between the first and third magnetic bodies or located at an interface between the second and third magnetic bodies.

(20) In the current injection-type magnetic domain wall-motion device described in Item (19), the junction between the first and third magnetic bodies and the junction between the second and third magnetic bodies are formed to have asymmetric structure such that a difference in resistance is readily created in the device.

BEST MODE FOR CARRYING OUT THE INVENTION

A current injection-type magnetic domain wall-motion device includes a microjunction structure including two magnetic bodies 1 and 2 and a magnetic body 3 sandwiched therebetween, the magnetization directions of the magnetic bodies 1 and 2 being antiparallel to each other. The magnetization direction of the device is controlled in such a manner that a pulse current (a current density of $10^4$-$10^7$ A/cm$^2$) is applied across junctions present in the combined microstructure such that a magnetic domain wall is moved by the interaction between the magnetic domain wall and the pulsed current in the same direction as that of the pulse current or in the direction opposite to that of the pulse current.

EXAMPLES

Embodiments of the present invention will now be described in detail.

Figure 1:
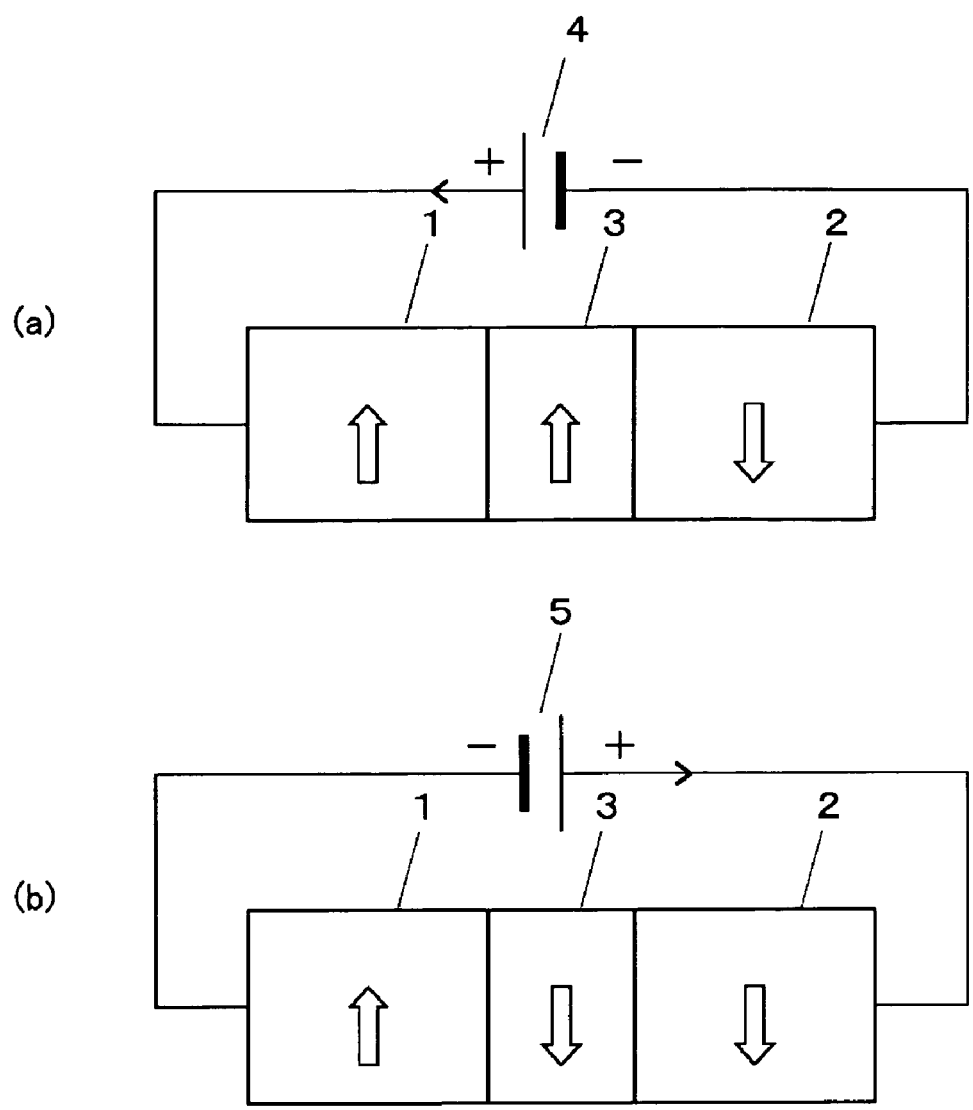
FIG. 1 includes schematic views of a current injection-type magnetic domain wall-motion device according to the present invention.

FIG. 1 includes schematic views of a current injection-type magnetic domain wall-motion device according to the present invention.

In this figure, reference numeral 1 represents a first magnetic body, reference numeral 2 represents a second magnetic body with a magnetization direction antiparallel to that of the first magnetic body 1, reference numeral 3 represents a third magnetic body sandwiched between the first and second magnetic bodies 1 and 2, and reference numerals 4 and 5 represent power supplies.

A microjunction structure is prepared such that the third magnetic body 3 is sandwiched between the two magnetic bodies (the first and second magnetic bodies 1 and 2) having magnetization directions (indicated by arrows shown in the figure) antiparallel to each other. Junction of the magnetic bodies may be achieved by forming the magnetic bodies in layers or by arranging the junction in plane of a device. The first to third magnetic bodies 1 to 3 may be made of the same material or different materials. Since the magnetization directions of the first and second magnetic bodies 1 and 2 must be antiparallel to each other, the first and second magnetic bodies 1 and 2 are prepared in such a way to include antiparallel directions in advance such as film formation in a magnetic field, or the magnetic moments of the first and second magnetic bodies 1 and 2 are aligned antiparallel to each other with an external magnetic field after film formation, using a difference in coercive force between the first and second magnetic bodies 1 and 2. In the case that the magnetization directions of the first and second magnetic bodies 1 and 2 are aligned antiparallel to each other with such external magnetic fields, when the first and second magnetic bodies 1 and 2 are made of different materials, a difference in coercive force of the materials themselves can be used. However, when the first and second magnetic bodies 1 and 2 are made of the same material, different coercive forces can be provided to the first and second magnetic bodies 1 and 2 by various techniques such as a technique using a pinned layer used to form a spin valve structure, a technique using shape anisotropy due to a difference in shape, a technique for forming the first and second magnetic bodies 1 and 2 so as to have different thicknesses, and a technique to apply external electric fields are applied to the first and second magnetic bodies 1 and 2 if they are made of a magnetic semiconductor.

In order that the magnetizations of the first and second magnetic bodies 1 and 2 are antiparallel to each other, a magnetic domain wall must be present between the first and second magnetic bodies 1 and 2. Therefore, the magnetic domain wall is encouraged to position at a junction between the first and third magnetic bodies 1 and 3 or between the second and third magnetic bodies 2 and 3. This can be achieved by at least one of the following techniques: (1) a technique in which the cross-sectional area of the third magnetic body 3 is reduced such that the energy loss, due to the creation of the magnetic domain wall, in the third magnetic body 3 is less than both that in the first magnetic body 1 and that in the second magnetic body 2; (2) a technique in which the third magnetic body 3 is formed using a material with a magnetization smaller than that of a material for forming the first and second magnetic bodies 1 and 2 if the third magnetic body 3 is made of different material from that for the first and second magnetic bodies 1 and 2, or in which the magnetization of a material for the third magnetic body 3 is reduced by applying an external electric field if the third magnetic body 3 is made of the same material as that for forming the first and second magnetic bodies 1 and 2, such that the energy loss due to the creation of the magnetic domain wall in the third magnetic body 3 is less than both that in the first magnetic body 1 and that in the second magnetic body 2; and (3) a technique in which constrictions are each provided at the junction interface between the first and third magnetic bodies 1 and 3 and the junction interface between the first and second magnetic bodies 1 and 2 so as to encourage the magnetic domain wall to be trapped at one of the constrictions.

The formation of elements according to embodiments of the present invention will now be described in detail.

Junction of magnetic bodies may be achieved by forming in layers (vertical arrangement) or by arranging the junction in plane of a device as described above.

Figure 2:
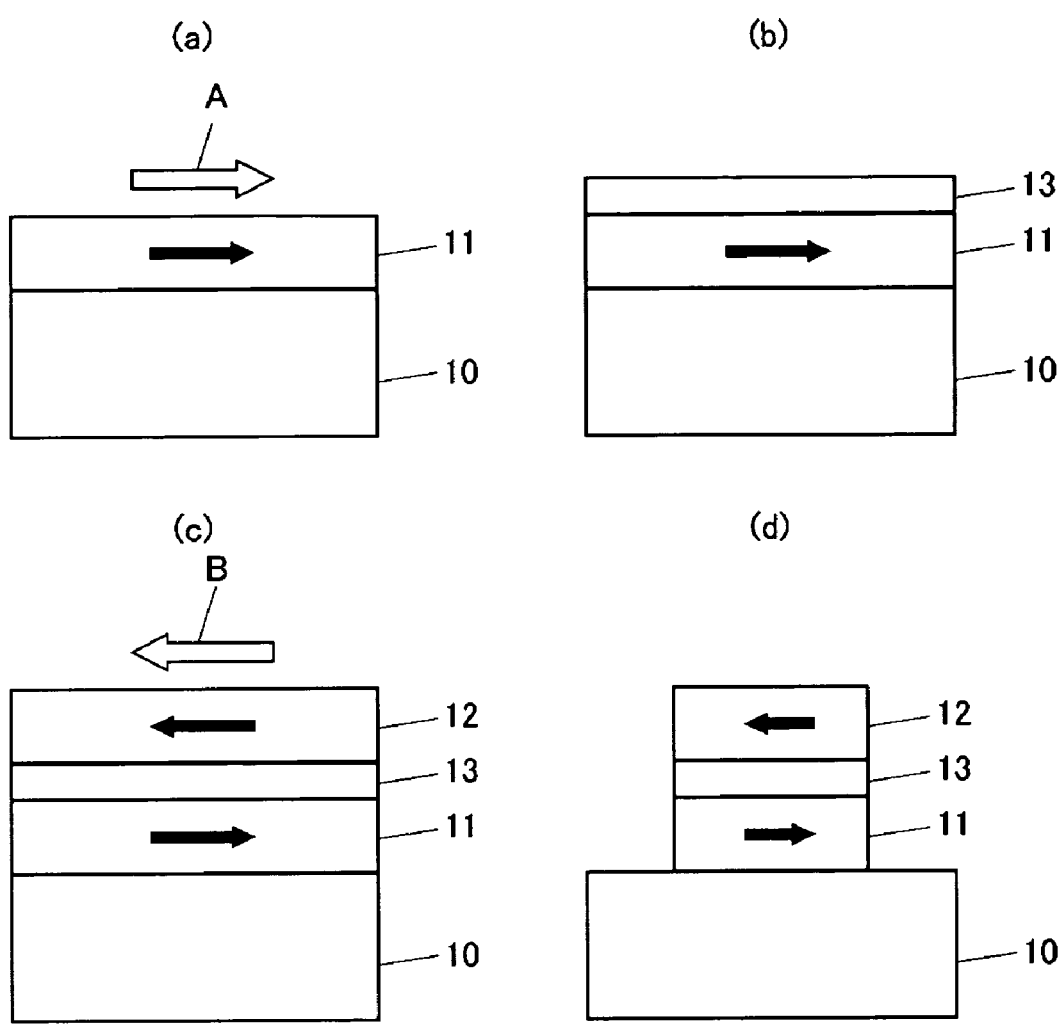
FIG. 2 includes schematic views of a device (Type 1), having a layered structure (vertical arrangement), according to an embodiment of the present invention.

FIG. 2 includes schematic views of an element (Type 1), having a layered structure (vertical arrangement), according to an embodiment of the present invention (corresponding to Claim 7).

As shown in FIG. 2(a), a first magnetic layer 11 is formed on a substrate 10. A magnetic field $M_{F1}$ is applied in the direction indicated by Arrow A during the formation of the first magnetic film 11. This allows the magnetization direction of the first magnetic film (an in-plane magnetized film) 11 to be aligned in the direction indicated by Arrow A.

As shown in FIG. 2(b), a third magnetic film 13 is then formed.

As shown in FIG. 2(c), a second magnetic film 12 is formed on the third magnetic film 13. A magnetic field $M_{F2}$ is applied in the direction indicated by Arrow B which is opposite to the direction indicated by Arrow A during the formation of the second magnetic film 12. This allows the magnetic moment of the second magnetic film (an in-plane magnetized film) 12 to be aligned in the direction indicated by Arrow B.

As shown in FIG. 2(d), microfabrication is performed, whereby the device is completed.

According to this procedure, the device having a layered structure (vertical arrangement) can be prepared such that the first magnetic film 11, the third magnetic film 13, and the second magnetic film 12 are formed on the substrate 10 and the first and second magnetic films 11 and 12 are magnetized antiparallel to each other.

In the case that the magnetic films are formed by a sputtering process or the like under the magnetic fields, the magnetization directions of the magnetic films can be each aligned in the directions of the corresponding magnetic fields even if the magnetic fields have a magnitude of 1 mT or less. Once the magnetic films are formed, the magnetization directions of the magnetic films do not change when magnetic fields smaller than the coercive forces of the magnetic films are applied to the magnetic layers.

Figure 3:
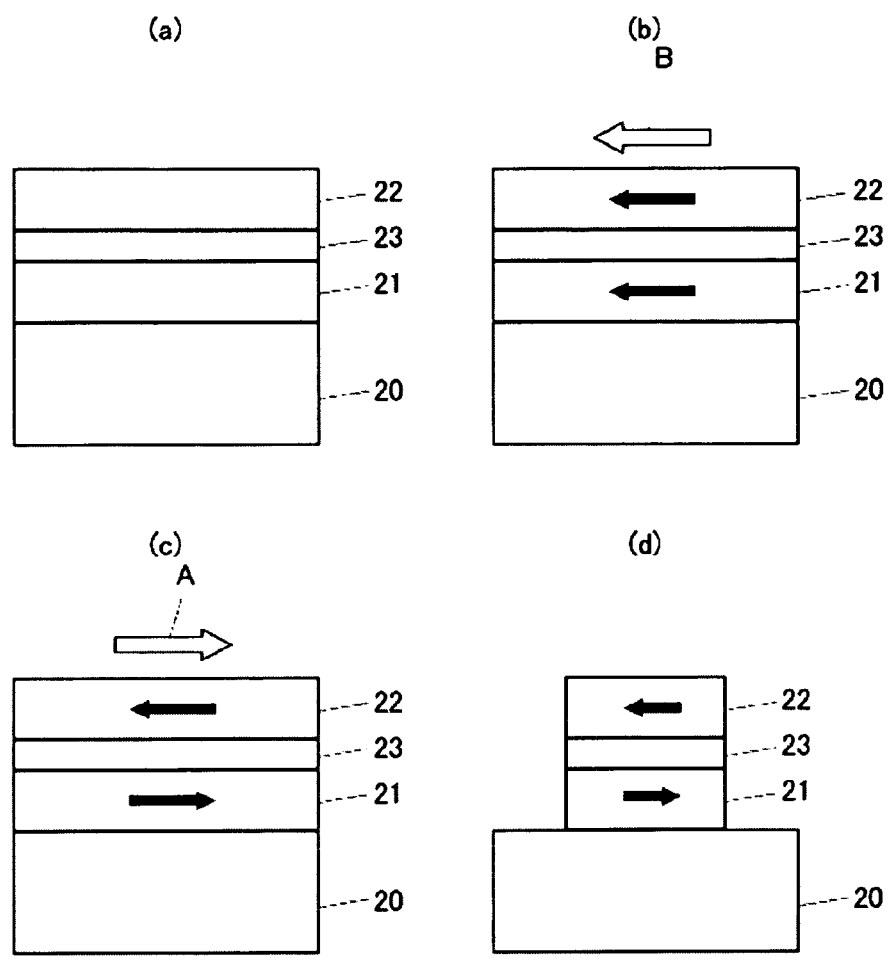
FIG. 3 includes schematic views of a device (Type 2), having a layered structure (vertical arrangement), according to an embodiment of the present invention.

FIG. 3 includes schematic views of a device (Type 2), having a layered structure (vertical arrangement), according to an embodiment of the present invention (corresponding to Claim 8, 9, 11, or 12).

As shown in FIG. 3(a), a first magnetic film 21 (a small coercive force) is formed on a substrate 20 and a third magnetic film 23 is then formed on the first magnetic layer 21. A second magnetic layer 22 (a large coercive force) is formed on the third magnetic film 23.

As described above, the first magnetic film 21, the second magnetic film 22, and the third magnetic film 23 are formed on the substrate 20 in that order. In this case, different coercive forces are provided to the first and second magnetic films 21 and 22. For example, a coercive force of the second magnetic film 22 is set to be greater than that of the first magnetic film 21. Alternatively, a coercive force of the first magnetic film 21 can be greater than that of the second magnetic layer 22.

As shown in FIG. 3(b), after the magnetic films are formed, an external magnetic field greater than the coercive force of the second magnetic film 22 is applied in the direction indicated by Arrow B, whereby the magnetization directions of the first and second magnetic layers 21 and 22 are aligned in the direction indicated by Arrow B.

As shown in FIG. 3(c), an external magnetic field that is smaller than the coercive force of the second magnetic film 22 but greater than that of the first magnetic film 21 is applied in the direction indicated by Arrow A which is opposite to the direction indicated by Arrow B, whereby only the magnetization direction of the first magnetic film 21 is aligned in the direction indicated by Arrow B.

As shown in FIG. 3(d), microfabrication is performed, whereby the device including a layered structure (vertical arrangement) consisting of the first magnetic film 21, the second magnetic film 22, and the third magnetic film 23 can be obtained.

The first and second magnetic films 21 and 22 are allowed to have different coercive forces in the following manner: a manner that the first and second magnetic layers 21 and 22 are formed using different magnetic materials so as to provide different crystalline magnetic anisotropies, a manner that a magnetic field is applied only to one of the first and second magnetic films 21 and 22 during the formation thereof so as to provide different growth-induced magnetic anisotropies to the first and second magnetic films 21 and 22 have, or a manner that the first and second magnetic layers 21 and 22 are formed so as to have different shapes (for example, film thicknesses), thereby providing a difference in magnetic shape anisotropy. The order of the steps of applying the magnetic fields to the magnetic films (shown in FIGS. 3(b) and 3(c)) and the step of performing the microfabrication (shown in FIG. 3(d)) can be reversed. In particular, in order to provide different magnetic shape anisotropies to the first and second magnetic films 21 and 22, it is preferable to perform the steps in reversed order.

Figure 4:
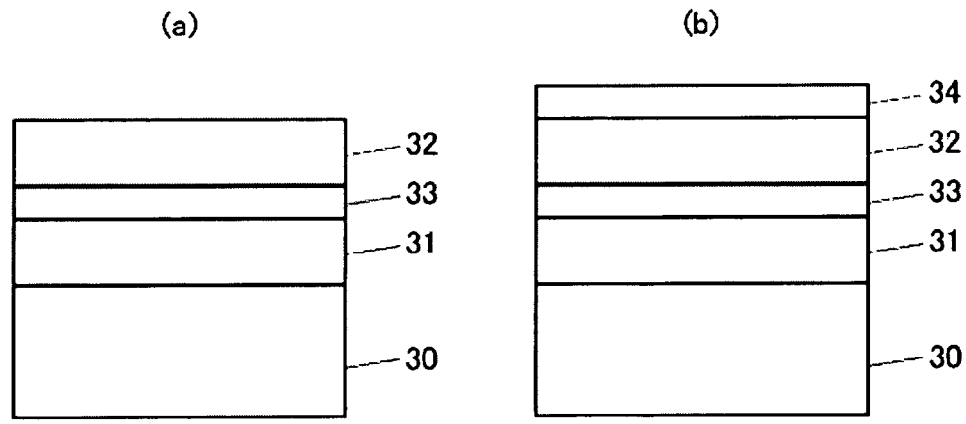
FIG. 4 includes schematic views of a device (Type 3), having a layered structure (vertical arrangement), according to an embodiment of the present invention.

FIG. 4 includes schematic views of a device (Type 3), having a layered structure (vertical arrangement), according to an embodiment of the present invention (corresponding to Claim 10).

As shown in FIG. 4(a), a first magnetic film 31 is formed on a substrate 30 and a third magnetic film 33 is then formed on the first magnetic film 31. A second magnetic film 32 is formed on the third magnetic film 33. The first and second magnetic films 31 and 32 disposed on the substrate 30 are made of the same magnetic material.

As shown in FIG. 4(b), an antiferromagnetic film 34 is formed on the second magnetic film 32. Magnetization of the second magnetic film 32 is magnetically coupled with the antiferromagnetic film 34 tightly by the exchange force, thereby creating a pinning effect. Therefore, a coercive force of the second magnetic film 32 has substantially greater than that of the first magnetic film 31. Steps, which are not shown, similar to the steps shown in FIG. 3(b) to 3(d) are then performed.

Figure 5:
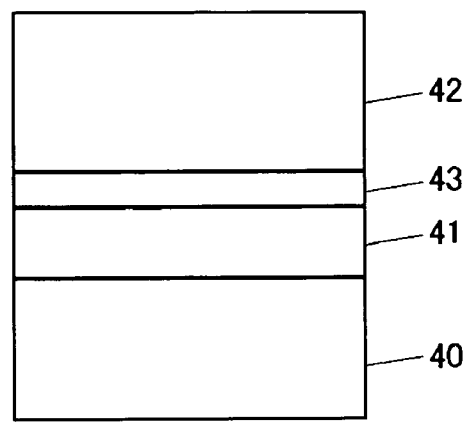
FIG. 5 is a schematic view of a device (Type 4), having a layered structure (vertical arrangement), according to an embodiment of the present invention.

FIG. 5 is a schematic view of a device (Type 4), having a layered structure (vertical arrangement), according to an embodiment of the present invention (corresponding to Claim 11).

In this embodiment, as shown in FIG. 5, a first magnetic film 41 (a small thickness) is formed on a substrate 40 and a third magnetic film 43 is then formed on the first magnetic film 41. A second magnetic film 42 (a large thickness) is formed on the third magnetic film 43. That is, the first magnetic film 41 disposed on the substrate 40 is formed to have a thickness less than that of the second magnetic film 42.

When the magnetic layers have different thicknesses, the magnetic layers have different coercive forces due to a difference in magnetic shape anisotropy, or other differences such as difference in composition. This allows the second magnetic film 42, which has a larger thickness, to have a larger coercive force. That is, when the first and second magnetic layers 41 and 42 are made of the same material, different coercive forces can be provided to the first and second magnetic layers 41 and 42 in such a manner that the first and second magnetic layers 41 and 42 are formed so as to have different thicknesses. Although the second magnetic film 42 has a thickness greater than that of the first magnetic film 41 as shown in FIG. 5, the second magnetic film 42 may have a thickness less than that of the first magnetic film 41.

Figure 6:
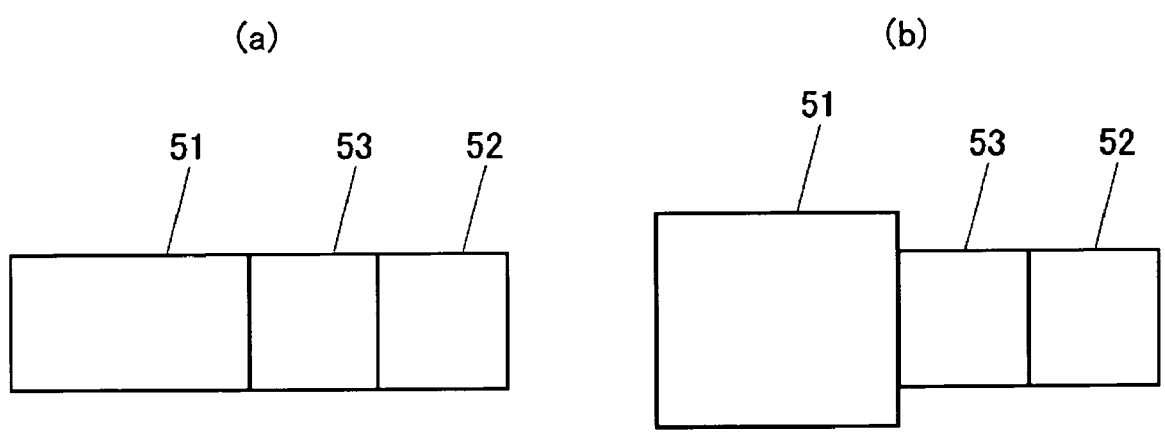
FIG. 6 includes schematic views of a device (Type 1), including laterally arranged magnetic bodies made of vertically magnetized film, according to an embodiment of the present invention.

FIG. 6 includes schematic views of a device (Type 1), including laterally arranged magnetic bodies made of vertically magnetized film, according to an embodiment of the present invention (corresponding to Claim 12). FIG. 6(a) is a side view of this device and FIG. 6(b) is a plan view thereof.

As shown in these figures, a first magnetic body 51 (magnetization M), a third magnetic body 53 (magnetization $M_3$), and a second magnetic body 52 (magnetization M) are laterally arranged. In this case, the first magnetic body 51 (magnetization M) has the largest width.

In this embodiment, the first magnetic body 51 (magnetization M) and the second magnetic body 52 (magnetization M) are made of the same vertically magnetized material and have different shapes. Different coercive forces are provided to the first magnetic body 51 (magnetization M) and the second magnetic body 52 (magnetization M) due to a difference in magnetic shape anisotropy therebetween. Although the first magnetic body 51 with a larger width has a coercive force greater than that of the second magnetic body 52 in FIG. 6, the first magnetic body 51 may have a width less than that of the second magnetic body 52.

Figure 7:
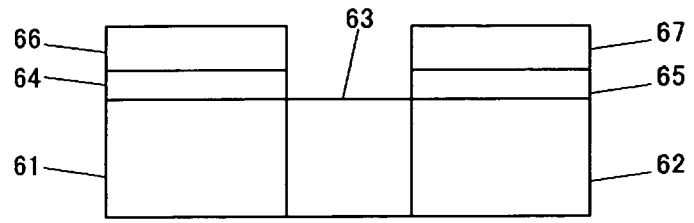
FIG. 7 includes schematic views of a device, including laterally arranged magnetic bodies made of vertically magnetized magnetic semiconductor, according to an embodiment of the present invention.
Figure 7:
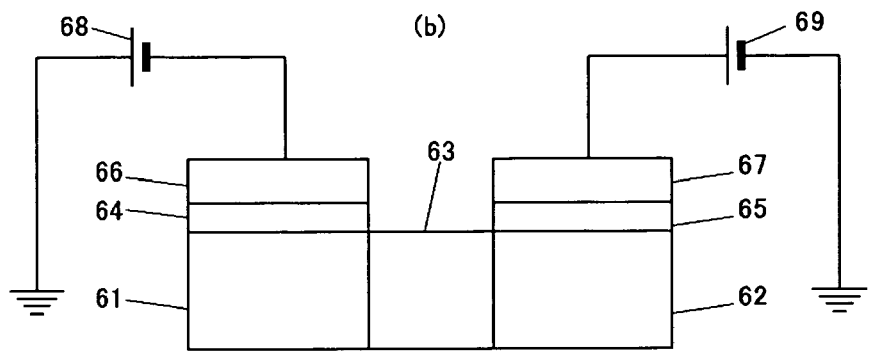

FIG. 7 includes schematic views of a device, including laterally arranged magnetic bodies made of vertically magnetized magnetic semiconductor, according to an embodiment of the present invention (corresponding to Claim 13). FIG. 7(a) is a side view showing a configuration of the device and FIG. 7(b) is an overall structural view of the device.

As shown in FIG. 7(a), a first magnetic body 61, a second magnetic body 62, and a third magnetic body 63 are formed by magnetic semiconductor. Insulating films 64 and 65 are formed on the first and second magnetic bodies 61 and 62, respectively, and electrodes 66 and 67 are formed on the insulating films 64 and 65, respectively.

As shown in FIG. 7(b), different electric fields are applied to the first and second magnetic bodies 61 and 62, whereby different coercive forces are provided to the first and second magnetic bodies 61 and 62. The application of a positive electric field leads to a decrease in coercive force and the application of a negative electric field leads to an increase in coercive force. Reference numerals 68 and 69 represent direct-current power supplies (batteries) for applying the electric fields.

Figure 8:
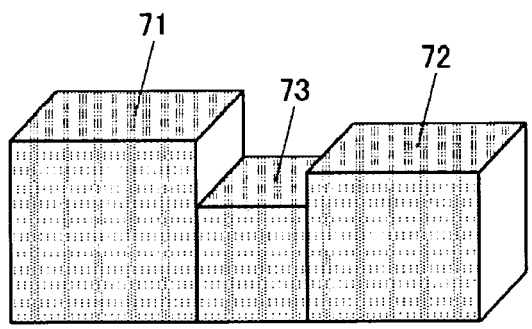
FIG. 8 includes schematic views of a device, including laterally arranged magnetic bodies, according to an embodiment of the present invention.
Figure 8:
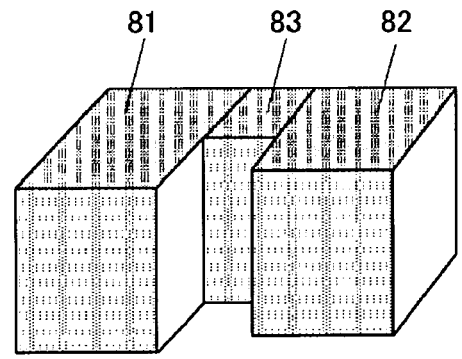

FIG. 8 includes schematic views of a device, including laterally arranged magnetic bodies, according to an embodiment of the present invention (corresponding to Claim 14). FIG. 8(a) is a perspective view showing a configuration of a first example of the device and FIG. 8(b) is a perspective view showing a configuration of a second example of the device.

In the first example shown in FIG. 8(a), a first magnetic body 71, a second magnetic body 72, and a third magnetic body 73 have the same depthlength but different heights. That is, these bodies have different cross-sectional areas. In particular, the third magnetic body 73 has the lowest height and therefore has the smallest cross-sectional area.

In the second example shown in FIG. 8(b), a first magnetic body 81, a second magnetic body 82, and a third magnetic body 83 have the same height but different depthlengths. That is, these bodies have different cross-sectional areas. In particular, the third magnetic body 83 has the smallest depthlength and therefore has the smallest cross-sectional area.

Figure 9:
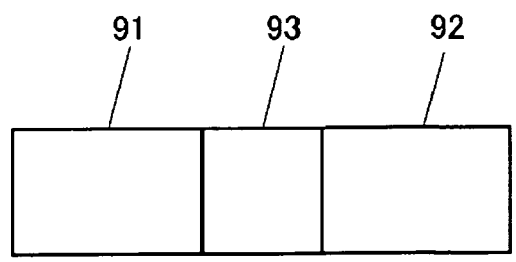
FIG. 9 is a schematic view of a device, including laterally arranged magnetic bodies made of vertically magnetized film, according to an embodiment of the present invention.

FIG. 9 is a schematic view of a device, including laterally arranged magnetic bodies made of vertically magnetized film, according to an embodiment of the present invention (corresponding to Claim 15).

As shown in FIG. 9, a first magnetic body 91 (magnetization $M_1$), a second magnetic body 92 (magnetization $M_2$), and a third magnetic body 93 (magnetization $M_3$) are formed. In this embodiment, the third magnetic body 93 is made of a magnetic material such that the magnetization $M_3$ of the third magnetic body 93 is smaller than both the magnetization $M_1$ of the first magnetic body 91 and the magnetization $M_2$ of the second magnetic body 92.

Figure 10:
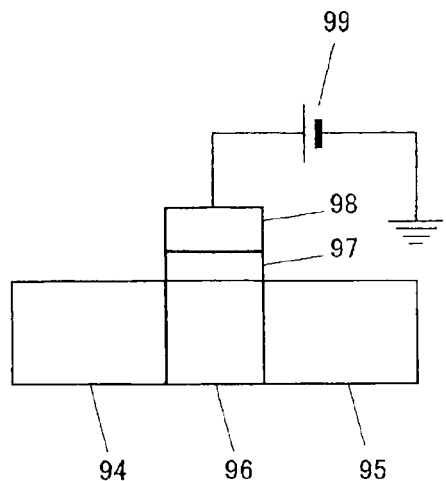
FIG. 10 is a schematic view of a device, including laterally arranged magnetic bodies made of vertically magnetized magnetic semiconductor, according to an embodiment of the present invention.

FIG. 10 is a schematic view of a device, including laterally arranged magnetic bodies made of vertically magnetized magnetic semiconductor, according to an embodiment of the present invention (corresponding to Claim 16).

In this embodiment, a first magnetic body 94, a second magnetic body 95, and a third magnetic body 96 are made of the same magnetic semiconductor. An external electric field is applied to the third magnetic body 96 through an electrode 98 and an insulating layer 97 such that the magnetization of the third magnetic body 96 would be smaller than both that of the first magnetic body 94 and that of the second magnetic body 95. Reference numeral 99 represents a direct-current power supply (battery) for applying the external electric field.

Figure 11:
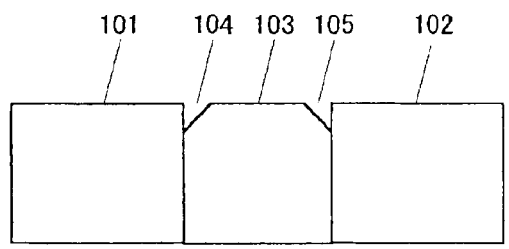
FIG. 11 is a schematic view of a device, including laterally arranged magnetic bodies made of vertically magnetized magnetic bodies, according to an embodiment of the present invention.

FIG. 11 is a schematic view of an element, including laterally arranged magnetic bodies made of vertically magnetized magnetic bodies, according to an embodiment of the present invention (corresponding to Claim 17).

As shown in this figure, a constriction 104 is formed at a junction interface between a first magnetic body 101 and a third magnetic body 103 and a constriction 105 is formed at a junction interface between a second magnetic body 102 and the third magnetic body 103.

According to this configuration, a magnetic domain wall can be readily trapped at the constriction 104 or 105; hence, the magnetic domain wall can be readily positioned at the junction interface between the first and third magnetic bodies 101 and 103 or the junction interface between the second and third magnetic bodies 102 and 103.

If a (pulse) current (a current density of $10^4$-$10^7$ A/cm$^2$) is applied across the junction interfaces of the device having the above configuration, the magnetic domain wall can be moved by the interaction between the magnetic domain wall and the current in the same direction as that of the current or in the direction opposite to that of the current (the relationship between the current direction and the direction of the magnetic domain wall motion depends on the interaction between the current and the magnetization and therefore depends on the material). Hence, the magnetic domain wall located at the interface between the first and third magnetic bodies 101 and 103 can be moved to the interface between the second and third magnetic bodies 102 and 103. Alternatively, the magnetic domain wall located at the interface between the second and third magnetic bodies 102 and 103 can be moved to the interface between the first and third magnetic bodies 101 and 103 by inverting the direction of the current. As shown in FIG. 1(a) or 1(b), the magnetization direction of the third magnetic body 3 can be controlled by inverting the current direction. The magnetization state of the third magnetic body 3 can be read out by applying a small current (less than $10^4$ A/cm$^2$) which is insufficient to move the magnetic domain wall, to a current injection terminal and measuring the resistance of the device. This is because the device has different resistances depending on whether the magnetic domain wall is located at the interface between the first and third magnetic bodies 1 and 3 or at the interface between the second and third magnetic bodies 2 and 3. When the first and third magnetic bodies 1 and 3 are made of the same material, the difference in resistance does not generate easily. However, function to vary the device resistance depending on the location of the magnetic domain wall can be provided in the device by forming the device in an asymmetric structure. This can be achieved, for example, by providing difference in dimension at the junction between the second and third magnetic bodies 2 and 3 or by providing a difference in the size of the constrictions formed at the junction interfaces. Alternatively, the magnetization of the third magnetic body 3 can be read out with high output using a giant magnetoresistance effect or a tunnel magnetoresistance effect in such a manner that a ferromagnetic layer of which the magnetization is pinned is added to the device via a non-magnetic layer. The magnetization state of the third magnetic body 3 can be measured using a transverse galvanomagnetic effect such as an anomalous Hall effect or a planar Hall effect in such a manner that a terminal for measurement is provided on the third magnetic body 3.

As described above, with the current injection-type magnetic domain wall-motion device, the magnetization direction of the magnetic body can be controlled or read out electronically without applying an external magnetic field; hence, the device can be used for various applications including memory devices.

The actual measurement example of a current injection-type magnetic domain wall-motion device according to an embodiment of the present invention will now be described.

Figure 12:
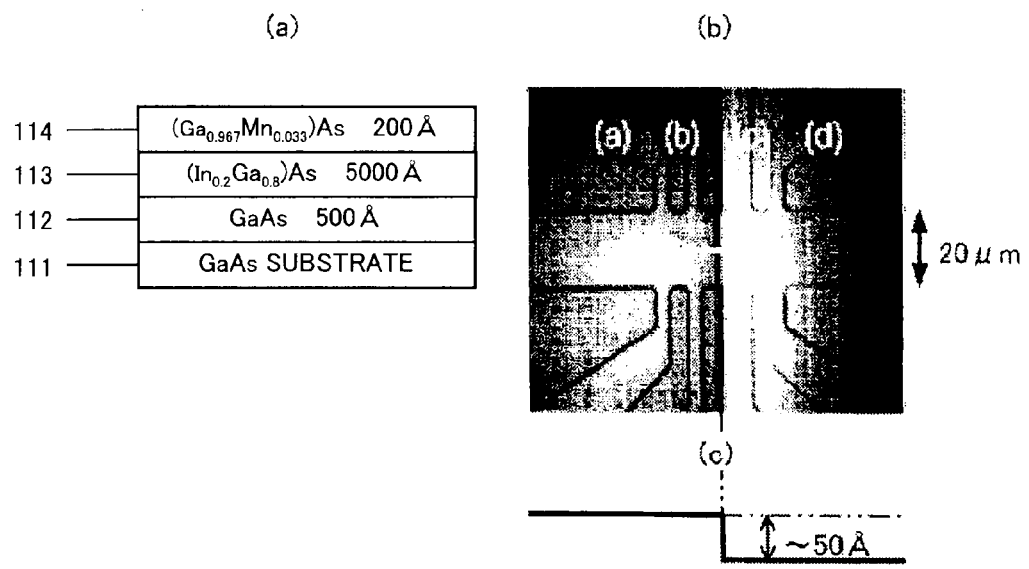
FIG. 12 includes views showing a configuration of a current injection-type magnetic domain wall-motion device (sample) according to an embodiment of the present invention.

FIG. 12 includes views showing a configuration of the current injection-type magnetic domain wall-motion device (sample). FIG. 12(a) is a structural view of the current injection-type magnetic domain wall-motion device, FIG. 12(b) is a photograph of the device shown in FIG. 12(a) and FIG. 12(c) is a sectional view of the device shown in FIG. 12(b).

In FIG. 12(a), reference numeral 111 represents a GaAs substrate, reference numeral 112 represents a GaAs layer (500 Å) formed on the GaAs substrate 111, reference numeral 113 represents an $(In_{0.2}Ga_{0.8})As$ layer (5000 Å) formed on the GaAs layer 112, and reference numeral 114 represents a $(Ga_{0.967}Mn_{0.033})As$ layer (200 Å) which is formed on the $(In_{0.2}Ga_{0.8})As$ layer 113 and which is made of a ferromagnetic semiconductor.

The current injection-type magnetic domain wall-motion device is manufactured using (Ga, Mn)As that is a ferromagnetic semiconductor having a out-of-plane easy axis. Instead of the (Ga, Mn)As layer, (In, Mn)As layer may be used. A microjunction structure including magnetic bodies which are made of the same material and which have different coercive forces can be formed in-plane in such a manner that a surface of the sample is partly etched in the case of using the (Ga, Mn)As layer 114 or an external electric field is applied to a metal electrode deposited on a part of the sample surface via an insulating layer in the case of using the (In, Mn)As layer (see Non-patent Document 1).

Advantages of these layers are substantially the same; hence, a configuration of the (Ga, Mn)As layer will now be principally described with reference to FIG. 12.

The current injection-type magnetic domain wall-motion device has a Hall-bar shape. The right half of the current injection-type magnetic domain wall-motion device is etched so as to have a thickness about 50 Å less than that of the left half thereof as shown in FIG. 12(c). Since the (Ga, Mn)As layer 114 shown in FIG. 12(a) has the Curie temperature of about 60 K, measurement is performed at a temperature of 60 K or lower. The magnetization of the right half and left half of the (Ga, Mn)As layer 114 are aligned antiparallel to each other using a difference in coercive force therebetween.

Figure 13:
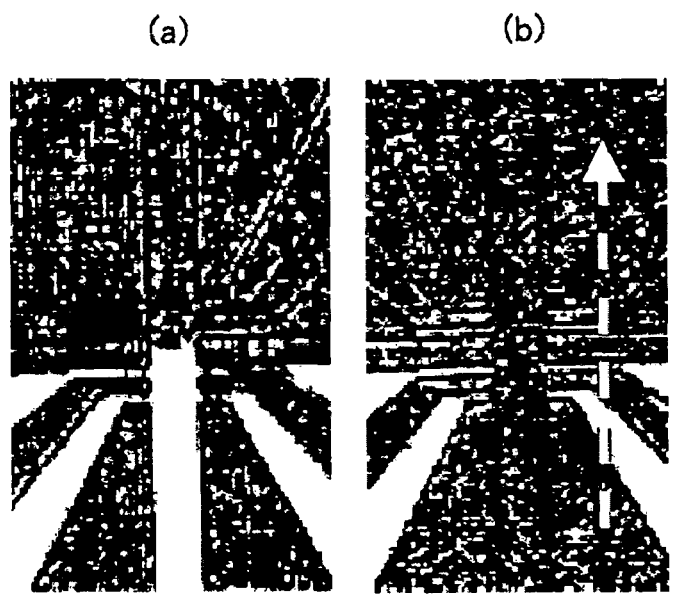
FIG. 13 includes illustrations showing magnetic domains of a current injection-type magnetic domain wall-motion device (a sample), the magnetic domains being observed with a magneto-optical Kerr-effect microscope.

This can be observed with a magneto-optical Kerr-effect microscope because of a difference in contrast as shown in FIG. 13(a). Also this can be electrically measured because the sign of the anomalous Hall effect in a pair of Hall terminals (a) and (b) is opposite to that in a pair of Hall terminals (c) and (d) as shown in FIG. 12(b). As shown in FIG. 13(b), if a pulse current is upwardly applied to the current injection-type magnetic domain wall-motion device, a magnetic domain wall is moved in the direction opposite to that of the current and the magnetization of the lower half of the current injection-type magnetic domain wall-motion device is reversed. This can be electrically measured because all the signs of voltages applied to the four pairs of Hall terminals are the same. In contrast, if a pulse current is downwardly applied to the current injection-type magnetic domain wall-motion device, the magnetic domain wall is trapped at a junction face and no change occurs in magnetic domains of the current injection-type magnetic domain wall-motion device.

Figure 14:
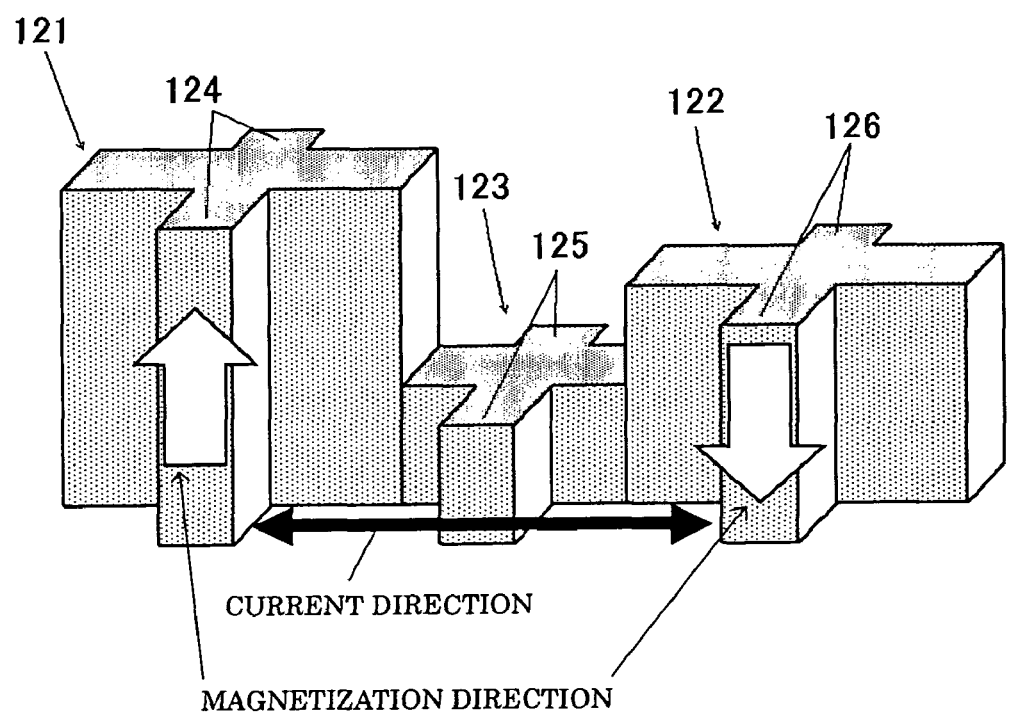
FIG. 14 is a schematic view of a current injection-type magnetic domain wall-motion device (the Curie temperature of about 100 K) which has a configuration similar to that shown in FIG. 12 and which includes a (Ga, Mn)As layer having two steps of difference in level.

FIG. 14 is a schematic view of a current injection-type magnetic domain wall-motion device (the Curie temperature of about 100 K) which has a configuration similar to that shown in FIG. 12 and which includes a (Ga, Mn)As layer having two steps of difference in level.

In this figure, reference numeral 121 represents a first magnetic body (corresponding to the first magnetic body 1 shown in FIG. 1), reference numeral 122 represents a second magnetic body (corresponding to the second magnetic body 2 shown in FIG. 1), and reference numeral 123 represents a third magnetic body (corresponding to the third magnetic body 3 shown in FIG. 1). These magnetic bodies have the same width. The first magnetic body 121 is taller than the second magnetic body 122, which is taller than the third magnetic body 123, thus two steps of difference in level are formed. Reference numeral 124 represents a pair of terminals formed on the first magnetic body 121, reference numeral 125 represents a pair of terminals formed on the third magnetic body 123, and reference numeral 126 represents a pair of terminals formed on the second magnetic body 122. An arrow indicates the direction of a current.

Figure 15:
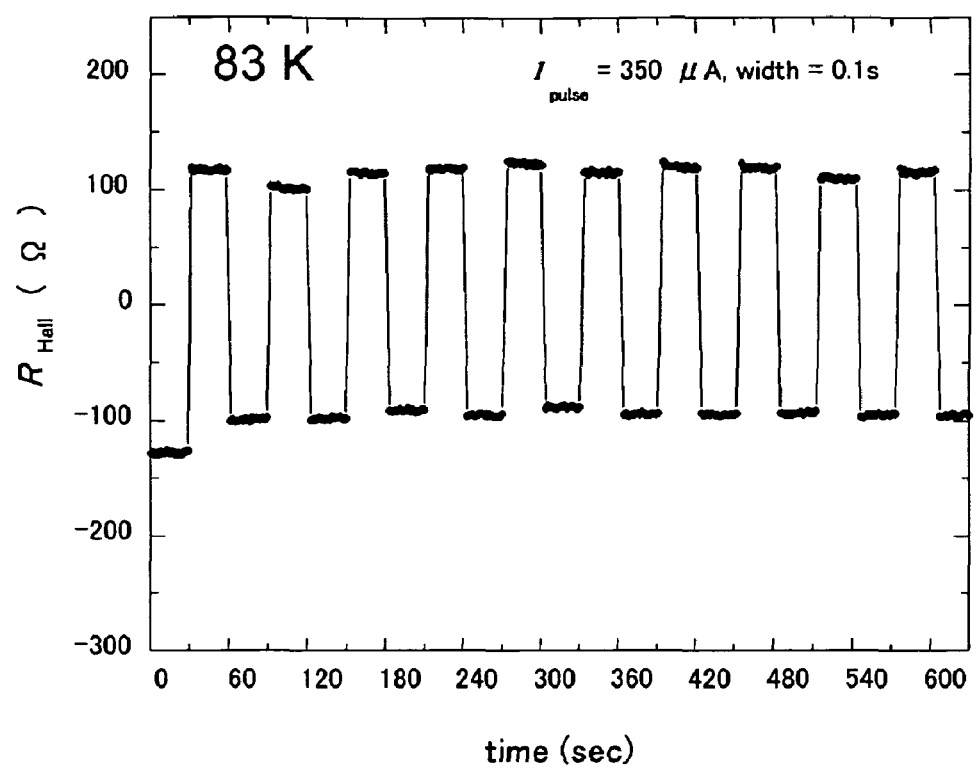
FIG. 15 is a graph showing an example observed using the anomalous Hall effect (a pair of terminals 125 formed on a third magnetic body 123 shown in FIG. 14) according to the present invention.

The magnetizations of both end portions that correspond to the first and second magnetic bodies 1 and 2 shown in FIG. 1 are initially aligned antiparallel to each other using an external magnetic field. This configuration allows the magnetization of the center portion corresponding to the third magnetic body 123 to be controlled reversibly and freely such that the magnetization direction of the third magnetic body 123 which is aligned parallel to that of the first magnetic body 121 to be aligned parallel to that of the second magnetic body, and vice versa, depending on the direction of a pulse current applied to this device. FIG. 15 is a graph showing this magnetization control electrically observed using the anomalous Hall effect (a pair of the terminals 125 formed on apart corresponding to the third magnetic body 123 shown in FIG. 14). Conditions of this observation are as follows: a pulse current value $I_{pulse}$ of 350 μA (corresponding to a current density of about $10^5$ A/cm$^2$), a pulse width of 0.1 second, a temperature of 83 K, and an external magnetic field of zero.

As shown in FIG. 15, the magnetization direction of the third magnetic body 123 is detected with the pair of terminals 125 formed on the third magnetic body 123 shown in FIG. 14, using the anomalous Hall effect. The sign of the Hall voltage is inverted by applying a positive or negative pulse current to this device. Hence, it is clearly shown that the magnetization direction of the third magnetic body 123 can be controlled reversibly and freely by applying a current and the magnetization direction thereof can be read out.

The present invention is not limited to the above embodiments. Various modifications may be made within the scope of the present invention. It should be construed that the present invention covers such modifications.

According to the present invention, the magnetization of a ferromagnetic body included in a magnetic semiconductor device can be reversed without using any external magnetic field. This leads to a reduction in power consumption.

Industrial Applicability

In a current injection-type magnetic domain wall-motion device according to the present invention, the magnetization direction of a magnetic body can be electrically controlled and read out without using any external magnetic field. Therefore, the current injection-type magnetic domain wall-motion device can be used for various applications including memory devices.

The invention claimed is:

1. A current injection-type magnetic domain wall-motion device comprising:
a first magnetic film directly adjacent to a third magnetic film and a second magnetic film directly adjacent to the third magnetic film, the second magnetic film having a magnetization direction antiparallel to that of the first magnetic film, a first microjunction interface between the first and the third magnetic films, and a second microjunction interface between the third and the second magnetic films, wherein
the magnetization direction of the third magnetic film is controlled by a current that is applied to pass through the first and second microjunction interfaces, wherein a magnetic domain wall present between the first and second magnetic film is moved within the third magnetic film in the same direction as a flow of the current or in the direction opposite to the flow of the current by direct interaction between the magnetic domain wall and the flow of the current.

2. The current injection-type magnetic domain wall-motion device according to claim 1, wherein the magnetic films are made of a magnetic semiconductor.

3. The current injection-type magnetic domain wall-motion device according to claim 2, wherein the magnetic semiconductor is a (Ga, Mn)As ferromagnetic semiconductor.

4. The current injection-type magnetic domain wall-motion device according to claim 2, wherein the magnetic semiconductor is an (In, Mn)As ferromagnetic semiconductor.

5. The current injection-type magnetic domain wall-motion device according to any one of claims 1 to 4, wherein the current is a pulse current.

6. The current injection-type magnetic domain wall-motion device according to claim 5, wherein the pulse current has a current density of $10^4$-$10^7$ A/cm$^2$.

7. The current injection-type magnetic domain wall-motion device according to claim 1, wherein the first and second magnetic films are formed in a magnetic field.

8. The current injection-type magnetic domain wall-motion device according to claim 1, wherein the magnetization directions of the first and second magnetic films are aligned antiparallel to each other with an external magnetic field using a difference in coercive force therebetween after film formation.

9. The current injection-type magnetic domain wall-motion device according to claim 8, wherein the first and second magnetic films are made of different materials.

10. The current injection-type magnetic domain wall-motion device according to claim 1, wherein the first and second magnetic films are made of the same material and the second magnetic film is magnetically coupled with an antiferromagnetic film disposed on the second magnetic film such that the first and second magnetic film have different coercive forces.

11. The current injection-type magnetic domain wall-motion device according to claim 1, wherein the first and second magnetic films are made of the same material, and have different film thicknesses, such that the first and second magnetic films have different coercive forces.

12. The current injection-type magnetic domain wall-motion device according to claim 1, wherein the first and second magnetic films are made of the same material, and have different shapes, such that the first and second magnetic films have different coercive forces due to difference of shape anisotropy.

13. The current injection-type magnetic domain wall-motion device according to claim 2, 3, or 4, wherein different external electric fields are applied to the first and second magnetic films made of the magnetic semiconductor, such that the first and second magnetic films have different coercive forces.

14. The current injection-type magnetic domain wall-motion device according to claim 1, wherein the third magnetic body has a reduced cross-sectional area such that the magnetic domain wall is encouraged to be positioned at the first or second microjunction interface, whereby the energy loss due to the creation of the magnetic domain wall in the third magnetic film is less than both that in the first magnetic film and that in the second magnetic film.

15. The current injection-type magnetic domain wall-motion device according to claim 1, wherein the third magnetic film is made of a material with a magnetization smaller than that of a material for forming the first and second magnetic films such that the magnetic domain wall is encouraged to be positioned at the first or second microjunction interface, whereby the energy loss due to the creation of the magnetic domain wall in the third magnetic film is less than both that in the first magnetic film and that in the second magnetic film.

16. The current injection-type magnetic domain wall-motion device according to claim 1, wherein the first to third magnetic films are made of the same material and the magnetization of the third magnetic film is rendered smaller than both that of the first magnetic film and that of the second magnetic film by applying an external electric field to the third magnetic film such that the magnetic domain wall is encouraged to be positioned at the first or second microjunction interface, whereby the energy loss due to the creation of the magnetic domain wall in the third magnetic film is less than both that in the first magnetic film and that in the second magnetic film.

17. The current injection-type magnetic domain wall-motion device according to claim 1, wherein the first and second microjunction interfaces have constrictions such that the magnetic domain wall is encouraged to be positioned at the first or second microjunction interface, whereby the magnetic domain wall is encouraged to be trapped at one of the constrictions.

18. The current injection-type magnetic domain wall-motion device according to claim 1, wherein the magnetization direction of the third magnetic film can be read out.

19. The current injection-type magnetic domain wall-motion device according to claim 18, wherein the magnetization state of the third magnetic film is read out in such a manner that the resistance of the third magnetic film is measured by applying a small current that is insufficient to move the magnetic domain wall, to a current injection terminal using a feature that the device has different resistances depending whether the magnetic domain wall is located at the first or second microjunction interface.

20. The current injection-type magnetic domain wall-moving device according to claim 19, wherein the first and second microjunction interfaces are formed to have asymmetric structure such that a difference in resistance is readily created in the third magnetic film.

21. The current injection-type magnetic domain wall-moving device according to claim 1, wherein the first and second magnetic films have fixed magnetization directions.

* * * * *